United States Patent
Li et al.

(10) Patent No.: US 10,784,767 B1
(45) Date of Patent: Sep. 22, 2020

(54) SWITCHING POWER CONVERTERS WITH ADAPTIVELY TRIGGERED ANALOG-TO-DIGITAL CONVERTERS

(71) Applicant: Astec International Limited, Kowloon (HK)

(72) Inventors: Zhi Zhi Li, Kowloon (HK); Chung Hang Ling, Shum Tseng (HK); Caiwang He, Shen Zhen (CN)

(73) Assignee: Astec International Limited, Kwun Tong (HK)

( * ) Notice: Subject to any disclaimer, the term of this patent is extended or adjusted under 35 U.S.C. 154(b) by 0 days.

(21) Appl. No.: 16/441,946

(22) Filed: Jun. 14, 2019

Related U.S. Application Data

(63) Continuation-in-part of application No. 16/426,967, filed on May 30, 2019, now abandoned.

(51) Int. Cl.
  *H02M 1/08* (2006.01)
  *H03M 1/12* (2006.01)
  *H02M 3/335* (2006.01)
  *H02M 3/158* (2006.01)

(52) U.S. Cl.
  CPC .......... *H02M 1/08* (2013.01); *H02M 3/1582* (2013.01); *H02M 3/33592* (2013.01); *H03M 1/12* (2013.01)

(58) Field of Classification Search
  CPC ........ H02M 1/08; H02M 1/0845; H02M 1/12; H02M 1/4208; H02M 3/155–3/158; H02M 3/1563; H02M 3/1582; H02M 3/1584; H02M 3/1588; H02M 3/33507; H02M 3/33523; H02M 3/33562; H02M 3/33592; Y02B 70/126; Y02B 70/1466; H02H 7/1213; H03F 2200/351

USPC .................................................. 323/282–285
See application file for complete search history.

(56) References Cited

U.S. PATENT DOCUMENTS

| | | | |
|---|---|---|---|
| 9,065,323 B2 * | 6/2015 | Phadke | H02M 7/02 |
| 9,450,496 B2 * | 9/2016 | Sigamani | H02M 3/33546 |
| 9,906,121 B2 * | 2/2018 | Boncato | H02M 3/04 |
| 9,973,098 B2 * | 5/2018 | Phadke | H02M 3/33569 |
| 10,014,771 B2 * | 7/2018 | Phadke | H02M 3/158 |
| 10,243,481 B2 * | 3/2019 | Deng | H02M 1/14 |
| 2018/0006577 A1 * | 1/2018 | Ng | H02M 1/0845 1/845 |

OTHER PUBLICATIONS

Jaroslav Musil, Use of PWM and ADC on MC56F84789 to Drive Dual PMS Motor FOC, NXP Semiconductors N.V., Oct. 2012, 26 pages.

* cited by examiner

*Primary Examiner* — Yemane Mehari

(57) ABSTRACT

A switching power converter includes a power circuit and a control circuit for receiving an analog signal representing a parameter of the power circuit. The control circuit includes an ADC for converting the analog signal into a digital signal, and a switch driver for generating a control signal for controlling a switch in the power circuit over multiple switching cycles. The control circuit is configured to adaptively determine a trigger point for activating the ADC within a switching cycle to sample the analog signal, and activate the ADC at the determined trigger point so a control parameter generated based on the digital signal is provided to the switch driver a minimal period of time before the next switching cycle begins. The adaptively determined trigger point optimizes phrase margin loss and bandwidth in the control circuit. Other example switching power converters and control circuits are also disclosed.

20 Claims, 7 Drawing Sheets

SWITCHING POWER CONVERTERS WITH ADAPTIVELY TRIGGERED ANALOG-TO-DIGITAL CONVERTERS

CROSS-REFERENCE TO RELATED APPLICATION

This application is a continuation-in-part of U.S. patent application Ser. No. 16/426,967 filed May 30, 2019. The entire disclosure of the above application is incorporated herein by reference.

FIELD

The present disclosure relates to switching power converters with adaptively triggered analog-to-digital converters.

BACKGROUND

This section provides background information related to the present disclosure which is not necessarily prior art.

Conventional switching power converters commonly include a power circuit having one or more power switches and a control circuit for controlling the power switches. The control circuit sometimes includes an analog-to-digital converter (ADC) for converting an analog signal into a digital signal, and a switch driver for providing control signals to the power switches based on control parameters generated based on the digital signal. The control circuit activates and deactivates the ADC each switching period so the ADC is synchronized with the beginning of each switching period. This ensures the switch driver has adequate time to apply the control parameters before the next switching period. For example, in each switching period, the ADC may be activated one microsecond after the start of the switching period, and the control parameters may be applied one microsecond before the start of the next switching period.

SUMMARY

This section provides a general summary of the disclosure, and is not a comprehensive disclosure of its full scope or all of its features.

According to one aspect of the present disclosure, a switching power converter includes a power circuit having a power switch, and a control circuit coupled to the power circuit for receiving an analog signal representing a parameter of the power circuit and providing a control signal to the power switch to control the power switch over a plurality of switching cycles. The control circuit includes an ADC for converting the analog signal into a digital signal, and a switch driver for generating the control signal over the plurality of switching cycles. The control circuit is configured to adaptively determine a trigger point for activating the ADC within a switching cycle of the plurality of switching cycles to sample the analog signal, and activate the ADC at the determined trigger point within the switching cycle so one or more control parameters generated based on the digital signal are provided to the switch driver a minimal period of time before the next switching cycle begins.

According to another aspect of the present disclosure, a control circuit for controlling at least one power switch in a power circuit of a switching power converter is disclosed. The control circuit is configured to receive an analog signal representing a parameter of the power circuit and provide a control signal to the at least one power switch to control the at least one power switch over a plurality of switching cycles. The control circuit includes an ADC for converting the analog signal into a digital signal, and a switch driver for generating the control signal over the plurality of switching cycles. The control circuit is further configured to adaptively determine a trigger point for activating the ADC within a switching cycle of the plurality of switching cycles to sample the analog signal, and activate the ADC at the determined trigger point within the switching cycle so one or more control parameters generated based on the digital signal are provided to the switch driver a minimal period of time before the next switching cycle begins.

According to yet another aspect of the present disclosure, a switching power converter includes a power circuit having a power switch, and a control circuit coupled to the power circuit for receiving an analog signal representing a parameter of the power circuit and providing a control signal to the power switch to control the power switch over a plurality of switching cycles. The control circuit includes an ADC for converting the analog signal into a digital signal and a switch driver for generating the control signal over the plurality of switching cycles. The control circuit is configured to adaptively determine a trigger point for activating the ADC within a switching cycle of the plurality of switching cycles to sample the analog signal.

Further aspects and areas of applicability will become apparent from the description provided herein. It should be understood that various aspects of this disclosure may be implemented individually or in combination with one or more other aspects. It should also be understood that the description and specific examples herein are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Corresponding reference numerals indicate corresponding parts and/or features throughout the several views of the drawings.

DETAILED DESCRIPTION

Figure 1:
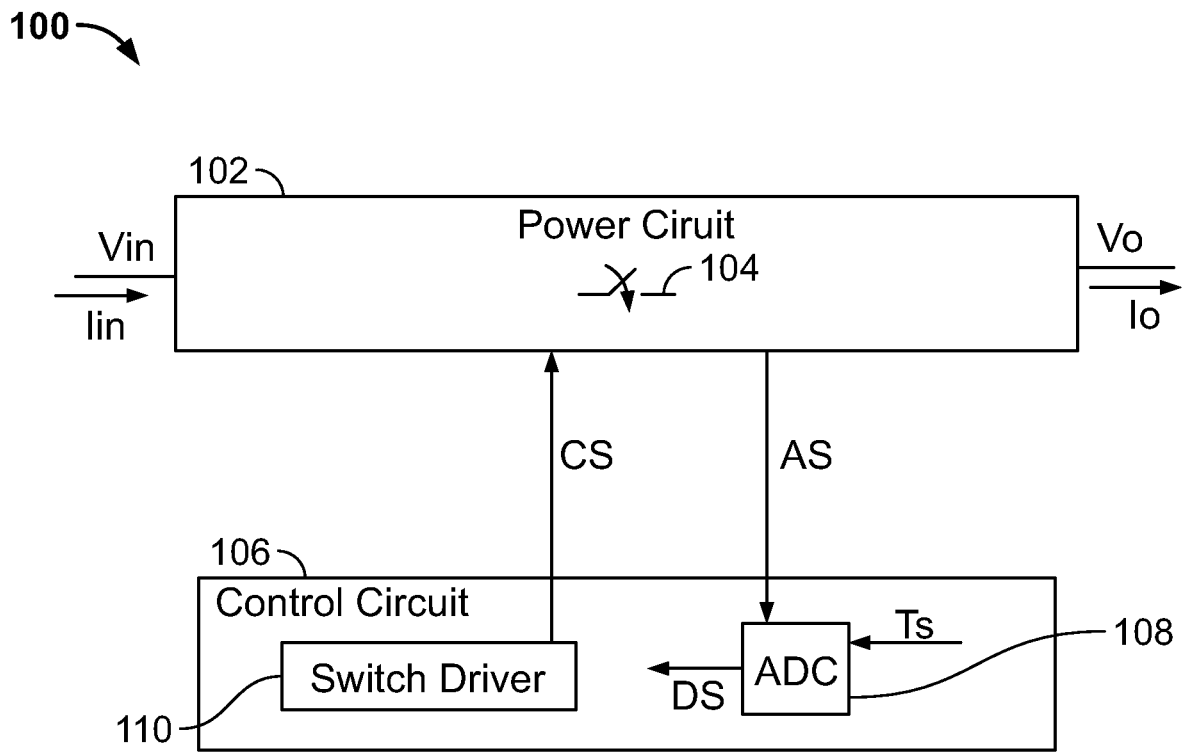
FIG. 1 is a block diagram of a switching power converter including a control circuit having an ADC that is activated at an adaptively determined trigger point to substantially reduce a time delay of the control circuit according to one example embodiment of the present disclosure.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

Example embodiments will now be described more fully with reference to the accompanying drawings.

A switching power converter according to one example embodiment of the present disclosure is illustrated in FIG. 1 and indicated generally by reference number 100. As shown in FIG. 1, the switching power converter 100 includes a power circuit 102 having at least one power switch 104, and a control circuit 106 coupled to the power circuit 102. The control circuit 106 receives an analog signal AS representing a parameter of the power circuit 102 and provides a control signal CS to the power switch 104 for controlling the power switch 104 over multiple switching cycles. As shown, the control circuit 106 includes an ADC 108 for converting the analog signal AS into a digital signal DS, and a switch driver 110 for generating the control signal CS over the multiple switching cycles. The control circuit 106 adaptively determines a trigger point for activating the ADC 108 within a switching cycle of the multiple switching cycles to sample the analog signal AS so one or more control parameters generated based on the digital signal are provided to the switch driver a minimal period of time before the next switching cycle begins.

For example, conventional control circuits commonly employ closed-loop control applications. As recognized by the subject inventors, control loops in conventional control circuits sometimes operate with delays that cause phase margins of the control loops to diminish. For example, phase margin loss may be determined by the formula 360*f*h, where f is the frequency and h is the delay. As a result, stability of the control loops decreases over time. However, if a time period between when a control parameter is provided to a switch driver (e.g., the switch driver 110) within one switching cycle and the next switching cycle begins is reduced (and sometimes eliminated), the delay in the control circuit may be reduced. The reduction in the delay reduces phase margin loss, and in turn increases the stability of the control loops as compared to the conventional control loops.

Figure 2:
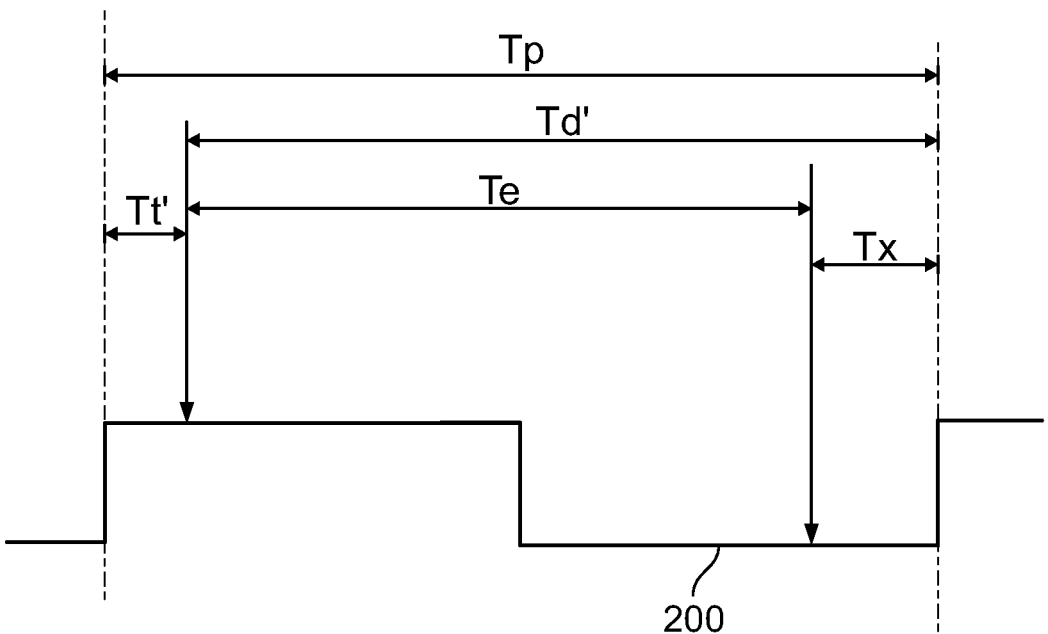
FIG. 2 is a waveform of a control signal generated by a conventional control circuit.
Figure 3:
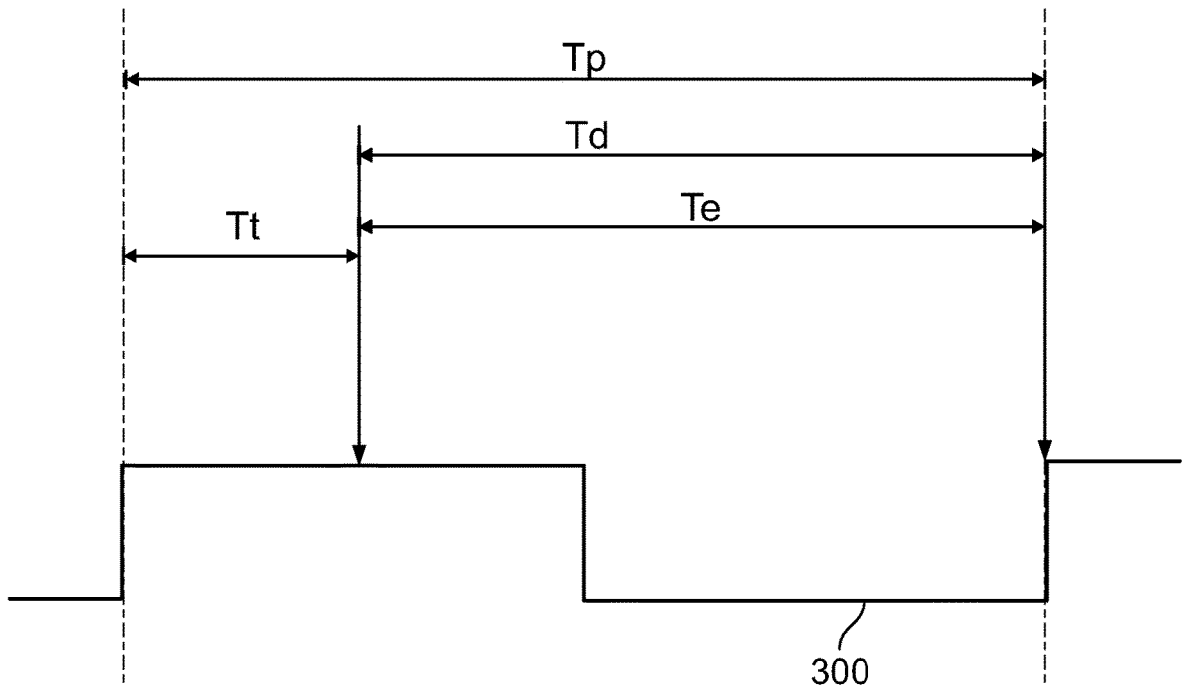
FIG. 3 is a waveform of a control signal generated by the control circuit of FIG. 1, according to another example embodiment.

For example, FIGS. 2 and 3 illustrate control signals 200, 300 over a switching cycle. The control signal 200 of FIG. 2 is generated by a conventional control circuit having an ADC and a switch driver, and the control signal 300 of FIG. 3 is generated by the control circuit 106 of FIG. 1 having the ADC 108 and the switch driver 110. As shown, the control signals 200, 300 each have a switching period Tp.

During the switching period Tp of FIG. 2, the conventional control circuit has a trigger time period Tt', an execution time period Te and an idle time period Tx. The trigger time period refers to a period of time from the start of the switching cycle to when the ADC is activated (e.g., begins sampling an analog signal representing a sensed parameter).

The execution time period Te refers to a period of time from when the ADC is activated to when control parameters are provided to the switch driver for generating the next switching cycle. Multiple control circuit functions may occur during the execution time period Te. For example, the functions may include sampling an analog signal, converting the analog signal to a digital signal, reading a digital value from the ADC, scaling the digital value, calculating one or more control parameters (e.g., the switching period Tp, a pulse width, etc.), providing the control parameters to the switch driver, updating one or more registers with the control parameters, etc.

The idle time period Tx refers to a period of time from when the execution time period Te concludes to the start of the next switching cycle. The idle time period Tx in combination with the execution time period Te creates a delay Td' from when the ADC is activated to the start of the next switching cycle. This delay Td' causes a phase margin of the control loop to diminish as explained above.

To optimize phase margin loss, it is desired to substantially reduce the delay time Td'. This may be accomplished by reducing the execution time Te and/or the idle period Tx of FIG. 2. The execution time Te is generally a constant value depending on, for example, processing speeds, coding, etc. As such, reducing the execution time Te may not be feasible. However, the subject inventors recognized that the idle time period Tx may be minimized (and sometimes eliminated) thereby reducing a delay from when the ADC is activated to the start of the next switching cycle. For example, the idle time period Tx may be reduced to below a few hundred nanoseconds. As further explained below, this may be accomplished by adaptively altering the trigger time period from switching cycle to switching cycle.

For example, during the switching period Tp of FIG. 3, the control circuit 106 has a trigger time period Tt and the execution time period Te. As shown in FIG. 3, the trigger time period Tt is increased as compared to the trigger time period Tt' of FIG. 2. This causes the execution time period Te of FIG. 3 to conclude as the next switching cycle begins. As such, a delay Td from when the ADC 108 is activated to the start of the next switching cycle is substantially equivalent to the execution time period Te as shown in FIG. 3. Therefore, by eliminating the idle time period Tx, the delay Td of FIG. 3 is substantially reduced as compared to the delay Td' of FIG. 2. This reduced delay Td results in less phase margin loss in the control circuit 106 as compared to the conventional control circuit having the delay Td'.

Figure 4:
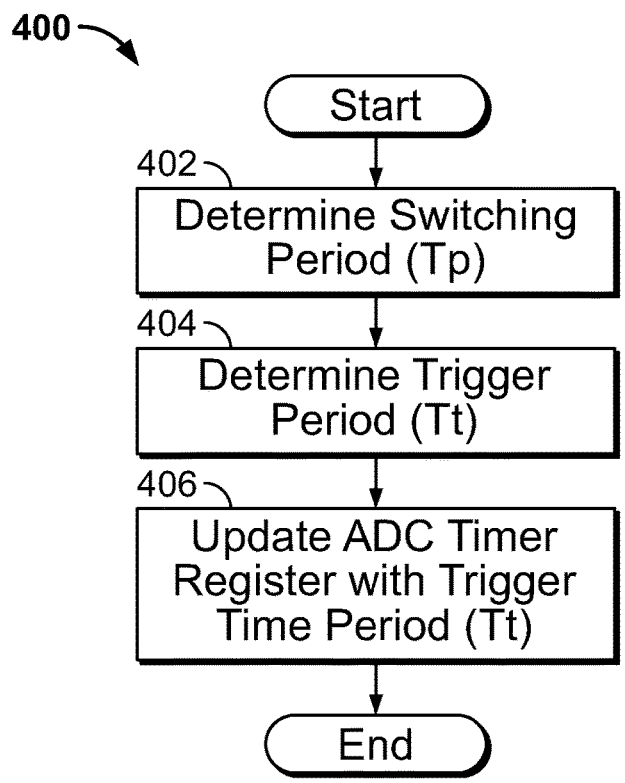
FIG. 4 is a flowchart of a process for determining a trigger time period within a switching cycle according to yet another example embodiment.

The trigger time period for a switching cycle may be altered by the control circuit 106. For example, FIG. 4 illustrates a process 400 for determining a trigger time period for a switching cycle. As shown in FIG. 4, the switching period Tp of FIG. 3 is determined in block 402. In some examples, the control circuit 106 of FIG. 1 may determine the switching period Tp based on the one or more control parameters as explained above. For example, in frequency modulation (FM) control, the switching period Tp may vary over multiple switching cycles. In such examples, the control parameters provided to the switch driver 110 are used to determine the switching period of the next switching cycle to ensure desired regulation (e.g., output voltage regulation). In other examples, pulse width modulation (PWM) control may be employed. In such examples, the switching period Tp may be constant from each switching cycle.

After the switching period Tp is determined, a trigger time period Tt is calculated in block 404 to ensure the execution time period Te of the control circuit 106 concludes as the next switching cycle begins as shown in FIG. 3. For example, the switching period Tp of FIG. 3 is equal to the sum of the trigger time period Tt and the delay Td, and is shown in equation (1) below.

$$Tp = Tt + Td \quad (1)$$

As explained above, the delay Td in FIG. 3 is substantially equivalent to the execution time period Te. As such, equation (1) may be rewritten as equation (2) below.

$$Tp = Tt + Te \quad (2)$$

Equation (2) may be rewritten to solve for Tt, as shown in equation (3) below.

$$Tt = Tp - Te \quad (3)$$

In this example, the switch period Tp is a known value as explained above, and the execution time Te may be considered a fixed value. For example, the execution time Te may be a maximum execution time of the control circuit 106 based on processing speeds, coding, etc. as explained above. As such, the control circuit 106 may calculate the trigger time period Tt based on the determined switch period Tp and the execution time Te.

Additionally, a timer register for activating the ADC 108 may be updated in block 406 of FIG. 4. For example, the control circuit 106 of FIG. 1 may include a timer for activating the ADC 108 at a point in time (e.g., a trigger point) after the start of the switching cycle. In such examples, the control circuit 106 may update the timer's register (e.g., located in a programmable memory) with the calculated trigger time period Tt.

Figure 5:
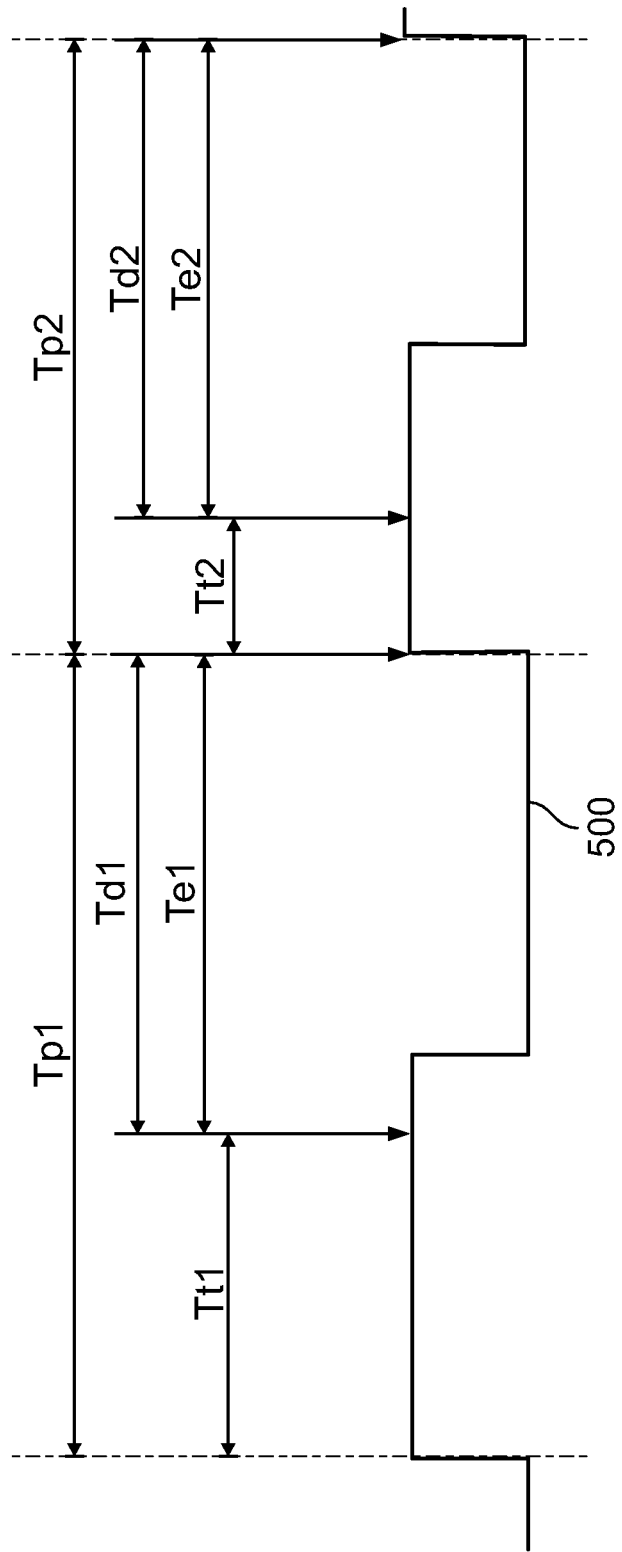
FIG. 5 is a waveform of a control signal generated by the control circuit of FIG. 1 and spanning over two consecutive switching cycles, according to another example embodiment.
Figure 6:
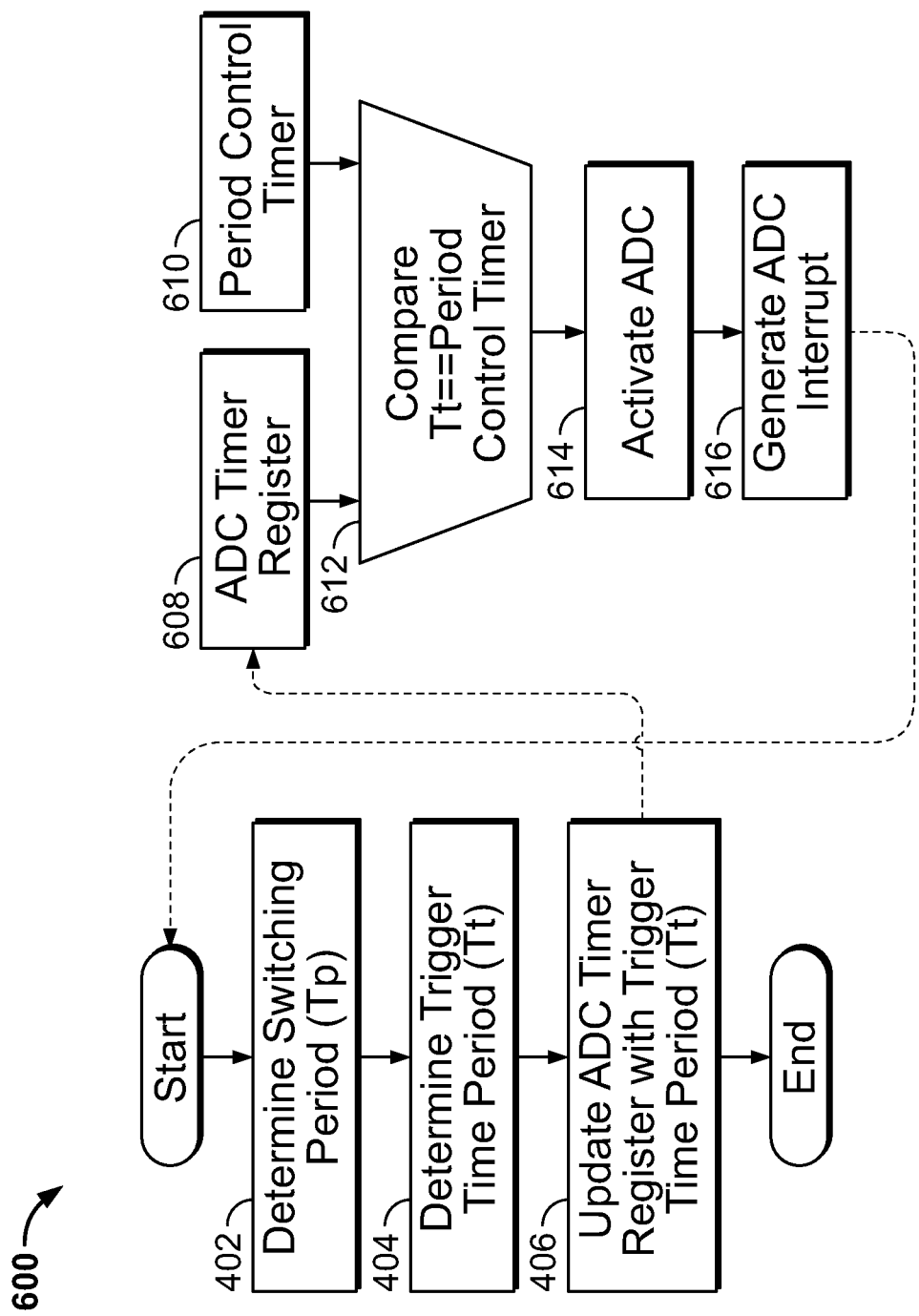
FIG. 6 is a flowchart of a process for determining multiple trigger time periods and activating the ADC of FIG. 1 multiple times over consecutive switching cycles according to yet another example embodiment.

In some examples, trigger time periods may be adaptively altered over multiple switching cycles such as consecutive switching cycles. In such examples, one trigger time period may be determined for one switching cycle, and another (e.g. new) trigger time period may be determined for the next switching cycle. For example, FIG. 5 illustrates a control signal 500 spanning over two consecutive switching cycles, and FIG. 6 illustrates a process 600 for determining trigger time periods for consecutive switching cycles. The control signal 500 may be generated by any of the control circuits disclosed herein (e.g., the control circuit 106 of FIG. 1, etc.) that alter a trigger time period over one or more switching cycles as explained herein.

As shown in FIG. 6, the switching period is determined in block 402, the trigger time period is determined in block 404, and the timer register for activating the ADC (e.g., the ADC 108 of FIG. 1) is updated as explained above. For example, the determined switching period referenced in FIG. 6 may be the switching period Tp1 for the first switching cycle shown in FIG. 5, and the determined trigger time period referenced in FIG. 6 may be the trigger time period Tt1 for the first switching cycle shown in FIG. 5.

After the timer register for activating the ADC is updated in block 406, the trigger time period Tt1 is compared to a switching period control timer to determine when to activate the ADC in block 612. For example, the trigger time period Tt1 stored in the ADC timer register is provided to a comparator in block 608, and a value of the switching period control timer is provided to the comparator in block 610. The period control timer may begin counting at the start of the switching cycle. Once the time value from block 610 is equal to the trigger time period Tt1 from block 608, the ADC is activated during the first switching cycle to begin sampling the analog signal in block 614. This activation point is sometimes referred to as a trigger point. After the ADC is activated, the control circuit enters its execution time period Te1 (which is substantially equivalent to a delay Td1 as explained above).

At some point after the ADC is activated and before the second switching cycle, the ADC may be disabled. For example, and as shown in FIG. 6, an ADC interrupt is generated (e.g., via software) in block 616 thereby causing the ADC to stop sampling and converting the analog signal.

After which, the process 600 returns to determine the switching period for the second switching cycle in block 402, determine the trigger time period for the second switching cycle in block 404, and update the ADC timer register again in block 406. The switching period for the second switching cycle is shown as the switching period Tp2 in FIG. 5, and the trigger time period for the second switching cycle is shown as the trigger time period Tt2 in FIG. 5. The process 600 then compares the trigger time period Tt2 to the switching period control timer (in block 612) to determine when to activate the ADC during the second switching cycle (in block 614) as explained above.

Referring back to FIG. 1, the analog signal AS received by the control circuit 106 may represent various parameters of the power circuit 102. For example, the analog signal AS may represent an input voltage Vin, an input current In, an output voltage Vo, an output current Io, etc. of the power circuit 102. In some preferred examples, the analog signal AS represents the output voltage Vo of the power circuit 102, and is used to regulate the output voltage Vo.

Figure 7:
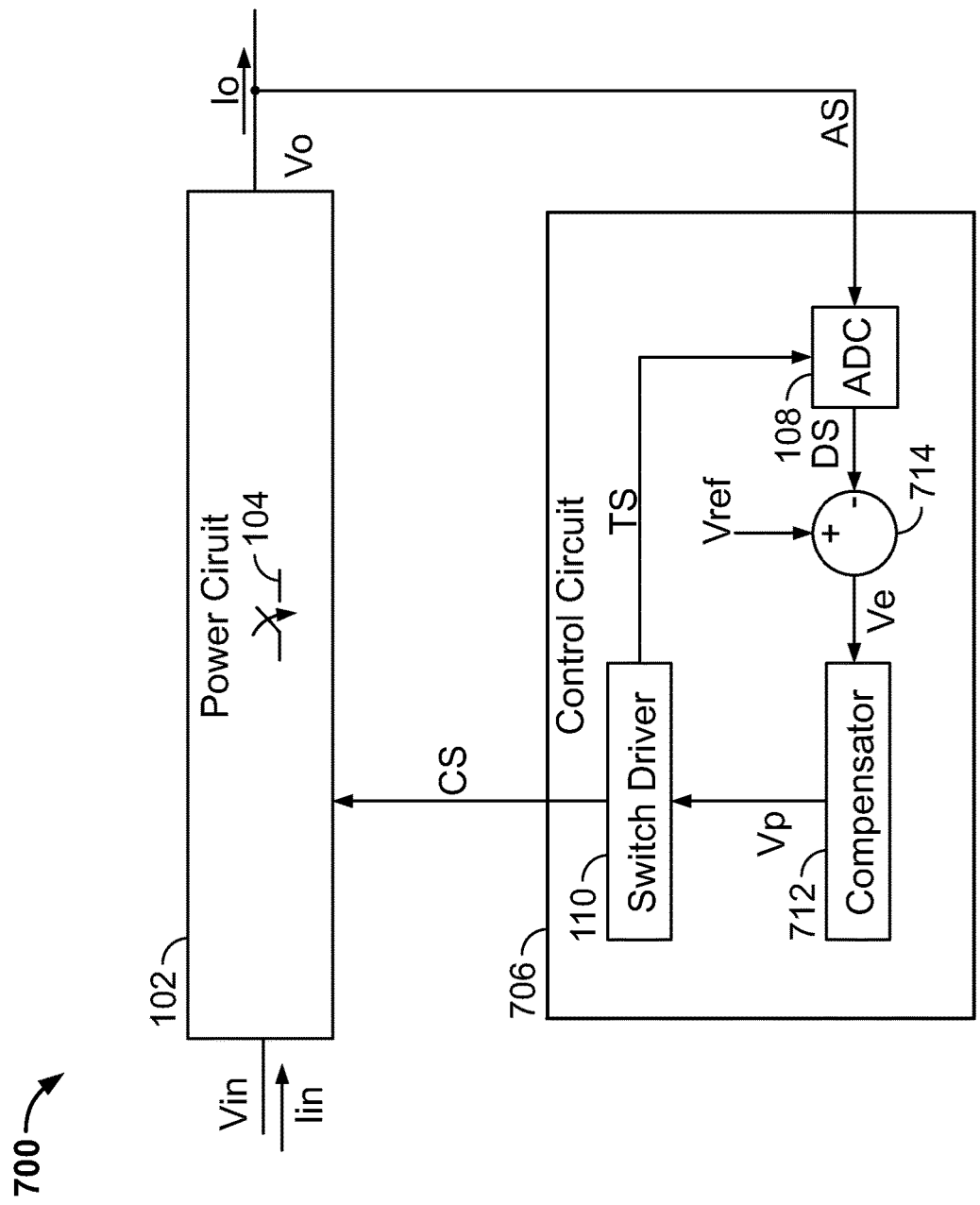
FIG. 7 is a block diagram of a switching power converter including a control circuit having an ADC, a compensator and a switch driver according to another example embodiment.

In some examples, the control circuits disclosed herein may include one or more compensators for calculating the control parameters used in generating the control signals. For example, FIG. 7 illustrates a switching power converter 700 including a compensator 712. Specifically, the switching power converter 700 includes the power circuit 102 of FIG. 1, and a control circuit 706 coupled to the power circuit 102. As shown in FIG. 7, the control circuit 706 includes the ADC 108 and the switch driver 110 of FIG. 1, the compensator 712 coupled between the ADC 108 and the switch driver 110, and an operator 714 coupled between the ADC 108 and the compensator 712.

During operation, the ADC 108 receives the analog signal AS representing a sensed output parameter (e.g., the output voltage Vo and/or the output current Io) of the power circuit 102, and converts this analog signal AS into the digital signal DS. The digital signal DS is then used by the operator 714 to calculate a voltage error signal Ve based on the difference between the digital signal DS and the voltage reference signal Vref. The voltage error signal Ve is provided to the compensator 712. The compensator 712 then calculates and provides a control parameter to the switch driver 110. For example, the compensator 712 may calculate the control parameter with firmware or another suitable manner. The calculated control parameter may include a switching period (e.g., for FM control), a pulse width (e.g., for PWM control), etc. In the particular example of FIG. 7, the compensator 712 calculates and provides a signal Vp representing the switching period for the next switching cycle. The switch driver 110 then generates (e.g. adjusts) the control signal CS based on the signal Vp for controlling the power switch 104.

As shown in FIG. 7, the switch driver 110 provides an ADC trigger signal TS to the ADC 108. The ADC trigger signal TS activates the ADC 108 thereby starting an execution time period. The ADC trigger signal TS may be sent after a determined trigger time period is equal to a period control timer as explained above.

The teachings disclosed herein may be employed in any power converter having a control circuit with pulse width modulation capabilities. For example, the control circuit may provide a control signal have a varying switching period (e.g., FM control) or a varying duty cycle (e.g., PWM control).

Figure 8:
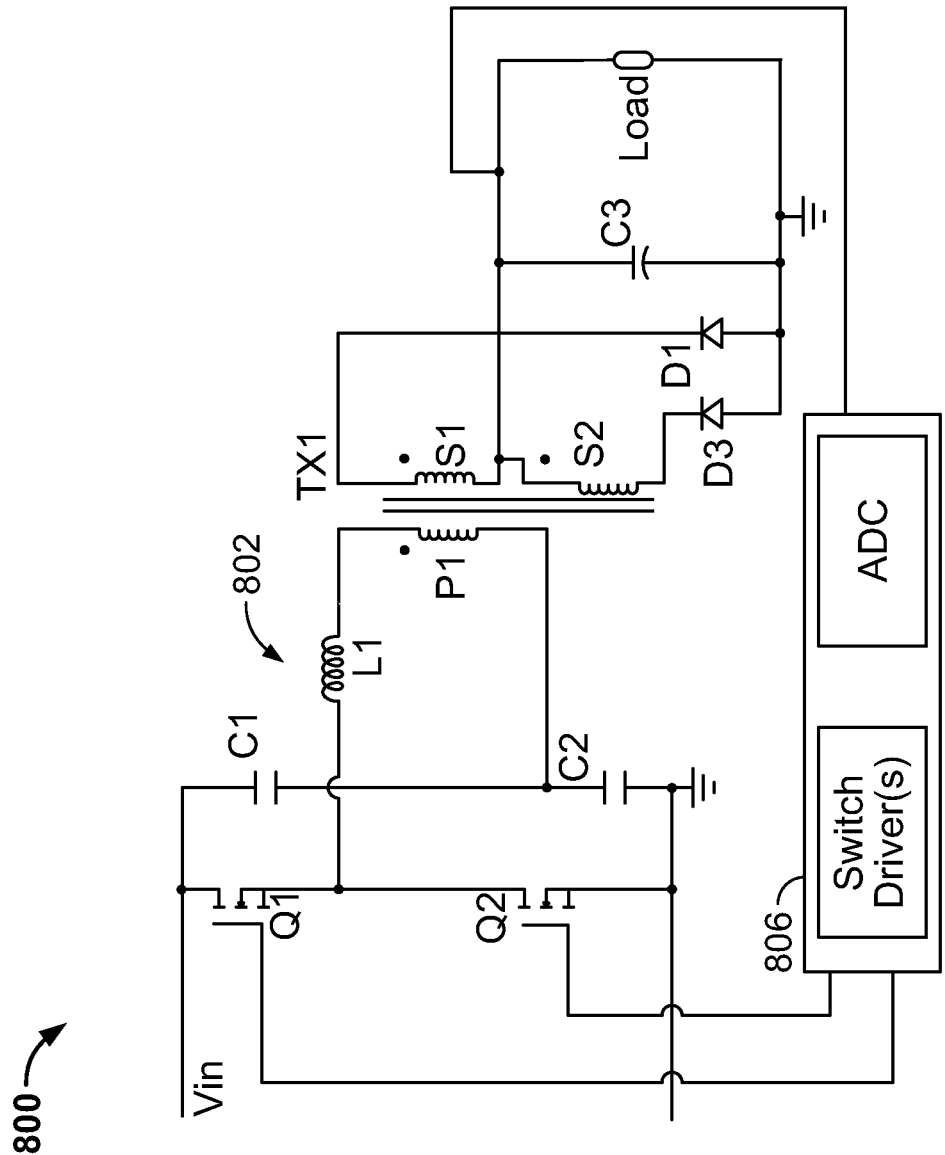
FIG. 8 is a block diagram of a switching power converter having a half-bridge LLC power circuit and a control circuit according to yet another example embodiment.

The power circuits disclosed herein may include any suitable topology such as a buck, boost, buck-boost, half-bridge, full-bridge, etc. topology. In some examples, the power circuits may include a resonance circuit. For example, FIG. 8 illustrates a switching power converter 800 including a power circuit 802 and a control circuit 806 coupled to the power circuit 802. In the particular example of FIG. 8, the power circuit 802 has a half-bridge LLC topology (with a maximum frequency of 400 kHz). For example, the power circuit 802 includes two power switches Q1, Q2 arranged in a half-bridge configuration, a transformer TX1, and multiple resonant components. The resonant components include two capacitors C1, C2, an inductor L1 and a magnetizing inductance of the transformer TX1. These component form a LLC resonant tank circuit. The control circuit 806 may be substantially similar to the control circuit 106 of FIG. 1 and/or the control circuit 706 of FIG. 7.

The power switches disclosed herein may be any suitable switching device. For example, any one of the power switches may include a transistor such as a MOSFET. For instance, the power switches Q1, Q2 of FIG. 8 are N-channel MOSFETs.

The compensators disclosed herein may include various types of controllers. For example, the compensator 712 of FIG. 7 may include a proportional-integral-derivative (PID) controller (e.g., a PID pole controller, a PID variant pole-zero controller, etc.), a proportional-integral (PI) controller, a 3p3z controller, a 2p2z controller and/or another suitable controller.

The control circuits disclosed herein may include an analog control circuit, a digital control circuit, or a hybrid control circuit (e.g., a digital control unit and an analog circuit). If, for example, the control circuit is a digital control circuit, the control circuit may be implemented with one or more hardware components and/or software. For example, instructions for performing any one or more of the features disclosed herein may be stored in and/or transferred from a non-transitory computer readable medium, etc. to one or more existing digital control circuits, new digital control circuits, etc. In such examples, one or more of the instructions may be stored in volatile memory, nonvolatile memory, ROM, RAM, one or more hard disks, magnetic disk drives, optical disk drives, removable memory, non-removable memory, magnetic tape cassettes, flash memory cards, CD-ROM, DVDs, cloud storage, etc. For example, the computer readable medium may include instructions for at least determining a trigger point for activating an ADC, and activating the ADC at the determined trigger point.

The digital control circuits may be implemented with one or more types of digital control circuitry. For example, the digital control circuits each may include a digital signal controller (DSC), a digital signal processor (DSP), a microcontroller unit (MCU), a field-programmable gate array (FPGA), an application-specific IC (ASIC), etc. For example, the control circuit 706 of FIG. 7 may be a DSP.

As explained above, each of the control circuits disclosed herein employing closed-loop control may adaptively adjust and determine the optimal trigger time period for activating its ADC during each switching cycle. This ensures a control parameter generated based on the ADC's digital signal is provided to the switch driver in the control circuit a minimal period of time before the next switching cycle begins. This causes the conclusion of the control circuit's execution time period (e.g., when the control parameter is applied for generating the control signal) is substantially synchronized with the end of each switching period. As a result, the delay time experienced in each switching cycle and the phase margin loss of the control loop are reduced as compared to conventional control circuits. Accordingly, the phase margin loss and the bandwidth may be optimized in the control circuit, which in turn causes greater control loop stability as compared to conventional control circuits.

Figure 9:
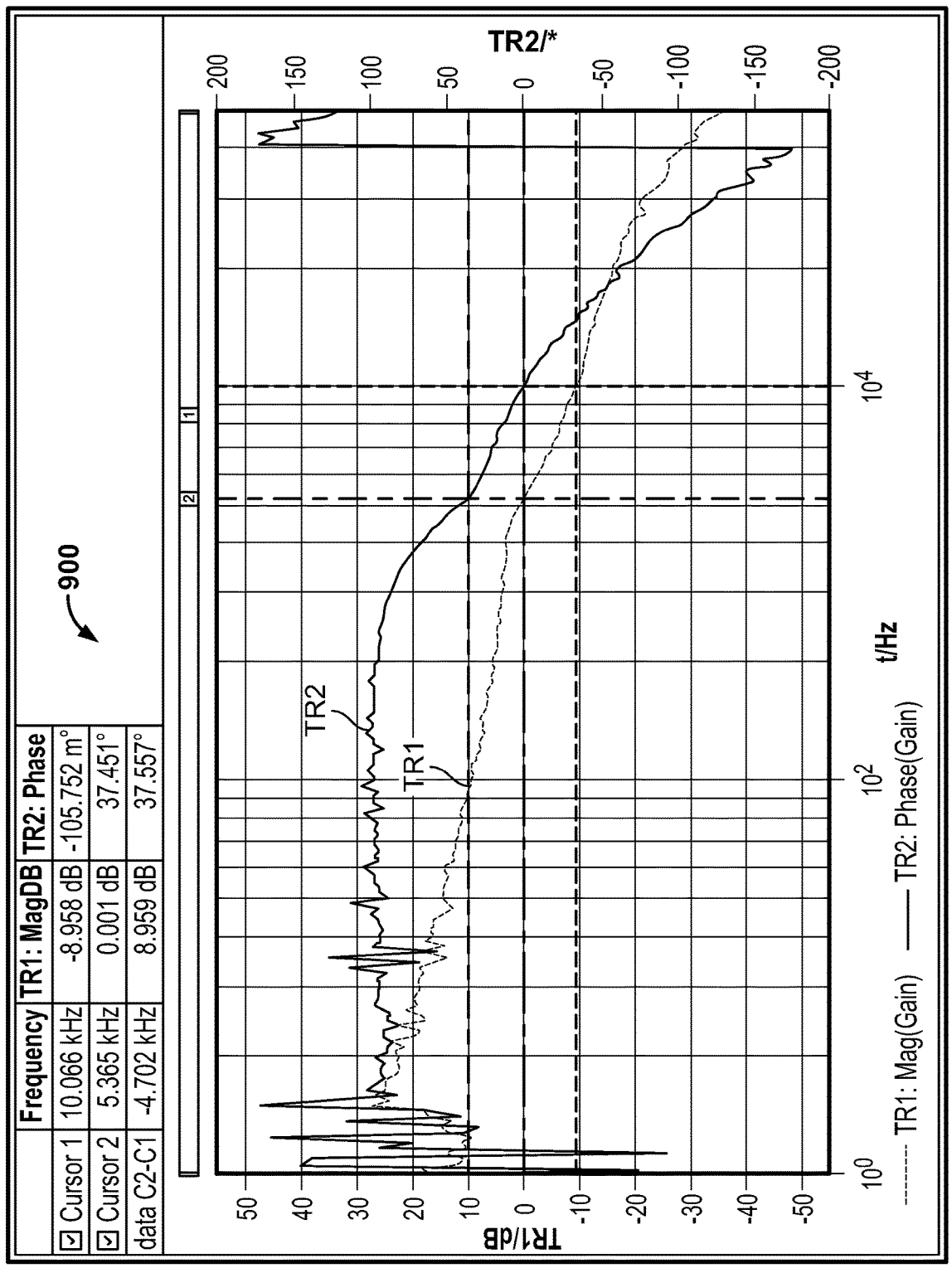
FIG. 9 is a bode plot of a control loop response using an adaptively determined ADC trigger at full load according to another example embodiment.

For example, FIG. 9 illustrates a bode plot 900 of a control loop response at full load. The control loop response of FIG. 9 employs the teachings disclosed herein of adaptively determining a trigger point for activating an ADC during each switching cycle to ensure a control parameter generated based on the ADC's digital signal is applied a minimal period of time before the next switching cycle begins. Testing has shown that the control loop response of FIG. 9 employing adaptively determined trigger points experiences an increased bandwidth, phase margin and gain margin as compared to control loop responses employing fixed ADC triggers. For instance, and as shown in the bode plot 900 of FIG. 9, the control loop response has a bandwidth over 5 kHz, a phase margin of about 37.6 degrees and gain margin of about 8.9 dB. In contrast, the control loop response of a conventional control circuit employing a fixed ADC trigger has a bandwidth of less than 3 kHz, a phase margin of 31.3 degrees and/or a gain margin is 7 dB.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

The invention claimed is:

1. A switching power converter comprising:
a power circuit including at least one power switch; and
a control circuit coupled to the power circuit for receiving an analog signal representing a parameter of the power circuit and providing a control signal to the at least one power switch to control the at least one power switch over a plurality of switching cycles, the control circuit including an analog-to-digital converter (ADC) for converting the analog signal into a digital signal, and a switch driver for generating the control signal over the plurality of switching cycles, the control circuit configured to adaptively determine a trigger point for activating the ADC within a switching cycle of the plurality of switching cycles to sample the analog signal, and activate the ADC at the determined trigger point within the switching cycle so one or more control parameters generated based on the digital signal are provided to the switch driver a minimal period of time before the next switching cycle begins.

2. The switching power converter of claim 1, wherein the control circuit is configured to adaptively determine a trigger point for activating the ADC within another switching cycle of the plurality of switching cycles, and activate the ADC at the determined trigger point within the other switching cycle so one or more control parameters generated based on the digital signal are provided to the switch driver a minimal period of time before the next switching cycle begins.

3. The switching power converter of claim 2, wherein the switching cycle and the other switching cycle are consecutive switching cycles of the plurality of switching cycles.

4. The switching power converter of claim 1, wherein the control circuit is configured to determine a switching period of the control signal during the switching cycle, and subtract an execution time period from the switching period to determine the trigger point, and wherein the execution time period extends from when the ADC is activated to when the one or more control parameters are provided to the switch driver.

5. The switching power converter of claim 4, wherein the execution time period is a fixed time period.

6. The switching power converter of claim 1, wherein the control circuit is configured to update a trigger control timer based on the determined trigger point.

7. The switching power converter of claim 1, wherein the control circuit includes a digital control circuit.

8. The switching power converter of claim 1, wherein the power circuit includes an LLC topology.

9. The switching power converter of claim 1, wherein the control circuit operates in pulse width modulated (PWM) control or frequency modulated (FM) control.

10. A control circuit for controlling at least one power switch in a power circuit of a switching power converter, the control circuit configured to receive an analog signal representing a parameter of the power circuit and provide a control signal to the at least one power switch to control the at least one power switch over a plurality of switching cycles, the control circuit comprising an ADC for converting the analog signal into a digital signal, and a switch driver for generating the control signal over the plurality of switching cycles, the control circuit further configured to adaptively determine a trigger point for activating the ADC within a switching cycle of the plurality of switching cycles to sample the analog signal, and activate the ADC at the determined trigger point within the switching cycle so one or more control parameters generated based on the digital signal are provided to the switch driver a minimal period of time before the next switching cycle begins.

11. The control circuit of claim 10, wherein the control circuit is configured to adaptively determine a trigger point for activating the ADC within another switching cycle of the plurality of switching cycles, and activate the ADC at the determined trigger point within the other switching cycle so one or more control parameters generated based on the digital signal are provided to the switch driver a minimal period of time before the next switching cycle begins.

12. The control circuit of claim 10, wherein the switching cycle and the other switching cycle are consecutive switching cycles of the plurality of switching cycles.

13. The control circuit of claim 10, wherein the control circuit is configured to determine a switching period of the control signal during the switching cycle, and subtract an execution time period from the switching period to determine the trigger point, and wherein the execution time period extends from when the ADC is activated to when the one or more control parameters are provided to the switch driver.

14. The control circuit of claim 13, wherein the execution time period is a fixed time period.

15. The control circuit of claim 13, wherein the control circuit is configured to update a trigger control timer based on the determined trigger point.

16. The control circuit of claim 15, wherein the control circuit includes a digital control circuit.

17. The control circuit of claim 10, wherein the control signal is a pulse width modulated (PWM) control signal or a frequency modulated (FM) control signal.

18. A switching power converter comprising a power circuit including at least one power switch, and a control circuit coupled to the power circuit for receiving an analog signal representing a parameter of the power circuit and providing a control signal to the at least one power switch to control the at least one power switch over a plurality of switching cycles, the control circuit including an analog-to-digital converter (ADC) for converting the analog signal into a digital signal and a switch driver for generating the control signal over the plurality of switching cycles based on one or more control parameters, the control circuit configured to adaptively determine a trigger point for activating the ADC within a switching cycle of the plurality of switching cycles to sample the analog signal.

19. The switching power converter of claim 18, wherein the control circuit is configured to determine a switching period of the control signal during the switching cycle based on the one or more control parameters, and subtract an execution time period from the switching period to determine the trigger point, and wherein the execution time period extends from when the ADC is activated to when the one or more control parameters are provided to the switch driver.

20. The switching power converter of claim 18, wherein the control circuit operates in pulse width modulated (PWM) control or frequency modulated (FM) control.

* * * * *